US012696495B2

(12) United States Patent

He et al.

(10) Patent No.: US 12,696,495 B2

(45) Date of Patent: Jul. 28, 2026

(54) SEMICONDUCTOR DEVICE AND METHOD FOR FABRICATING SAME

(71) Applicant: CHANGXIN MEMORY TECHNOLOGIES, INC., Hefei (CN)

(72) Inventors: Zheng He, Hefei (CN); Qiong Wu, Hefei (CN); Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 483 days.

(21) Appl. No.: 18/151,439

(22) Filed: Jan. 8, 2023

(65) Prior Publication Data

US 2024/0063256 A1 Feb. 22, 2024

(30) Foreign Application Priority Data

Aug. 22, 2022 (CN) .......................... 202211009054.5

(51) Int. Cl.
H10D 62/10 (2025.01)
H10D 30/01 (2025.01)
(Continued)

(52) U.S. Cl.
CPC ......... H10D 62/102 (2025.01); H10D 30/014 (2025.01); H10D 30/43 (2025.01);
(Continued)

(58) Field of Classification Search
CPC .. H10D 62/102; H10D 62/235; H10D 30/014; H10D 30/43; H10D 30/6757; H10D 30/6735
See application file for complete search history.

(56) References Cited

U.S. PATENT DOCUMENTS

| | | | | |
|---|---|---|---|---|
| 5,581,100 A | * | 12/1996 | Ajit ...................... | H10D 12/211 257/E29.255 |
| 2022/0352311 A1 | * | 11/2022 | Chang .................. | H10D 30/031 |

FOREIGN PATENT DOCUMENTS

| | | |
|---|---|---|
| CN | 103280464 A | 9/2013 |
| CN | 107068734 A | 8/2017 |
| CN | 108493250 A | 9/2018 |

OTHER PUBLICATIONS

Erben E, Hempel K, Triyoso D. Work Function Setting in High-k Metal Gate Devices [Internet]. Complementary Metal Oxide Semiconductor. InTech; 2018. (Year: 2018).*

(Continued)

*Primary Examiner* — Brigitte A Paterson

(74) *Attorney, Agent, or Firm* — Intellectual Valley Law, P.C.

(57) ABSTRACT

Embodiments relate to the field of semiconductors, and provide a semiconductor device and a method for manufacturing the same. The semiconductor device includes: an active pillar including a channel region and a source/drain region arranged on two sides of the channel region; and a gate structure surrounding at least part of the channel region. The channel region includes a peripheral portion and a central portion, the peripheral portion is positioned between the gate structure and the central portion, the source/drain region and the peripheral portion have a first doping type, and the central portion has a second doping type, where the first doping type is one of N-type and P-type, and the second doping type is other one of the N-type and the P-type. At least problems of greater difficulty in turning off existing junctionless field effect transistor and poorer turn-off effect may be solved.

15 Claims, 7 Drawing Sheets

(51) Int. Cl.
   *H10D 30/43*          (2025.01)
   *H10D 30/67*          (2025.01)
   *H10D 62/17*          (2025.01)

(52) U.S. Cl.
   CPC ..... *H10D 30/6735* (2025.01); *H10D 30/6757*
              (2025.01); *H10D 62/235* (2025.01)

(56)                References Cited

OTHER PUBLICATIONS

The First Office Action and Search Report issued in Chinese corresponding application 202211009054.5, mailed on Feb. 9, 2026.

* cited by examiner

SEMICONDUCTOR DEVICE AND METHOD FOR FABRICATING SAME

CROSS-REFERENCE TO RELATED APPLICATION

This application claims priority to Chinese Patent Application No. 202211009054.5, titled "SEMICONDUCTOR DEVICE AND METHOD FOR FABRICATING SAME" and filed to the State Patent Intellectual Property Office on Aug. 22, 2022, the entire contents of which are incorporated herein by reference.

TECHNICAL FIELD

Embodiments of the present disclosure relate to the field of semiconductors, and more particularly, to a semiconductor device and a method for fabricating the same.

BACKGROUND

As a semiconductor device, a junction field-effect transistor (JFET) is a three-terminal active device having an amplification function, belonging to the simplest type of unipolar field-effect transistors, and may be classified into an N-channel JFET or a P-channel JFET. Taking the N-channel JFET as an example, two highly-doped P regions are fabricated on a same N-type semiconductor, and the two P regions are connected to each other. An electrode drawn is called a gate, and two electrodes are drawn from two ends of the N-type semiconductor, which are called a drain and a source respectively. However, as a dimension of the device continues to shrink and a source-drain distance continues to shrink, a short-channel effect may be caused.

To solve this problem, a junctionless field effect transistor (JLFET) is proposed. Compared with a traditional JFET, a source, a channel and a drain of the JLFET have the same impurity doping type, and the JLFET has no PN junction and belongs to majority carrier conductive devices. A doping concentration gradient of the JLFET is gentler, an implementation process is simpler, and moreover, a thermal budget is less restricted, which is more advantageous to eliminating the short-channel effect.

However, the existing JLFET has problems of greater difficulty in turning off the existing JLFET and poorer turn-off effect.

SUMMARY

Embodiments of the present disclosure provide a semiconductor device and a method for fabricating the same.

According to some embodiments of the present disclosure, one aspect of the embodiments of the present disclosure provides a semiconductor device, including: an active pillar including a channel region and a source/drain region arranged on two sides of the channel region; and a gate structure surrounding at least part of the channel region. The channel region includes a peripheral portion and a central portion, the peripheral portion is positioned between the gate structure and the central portion, the source/drain region and the peripheral portion have a first doping type, and the central portion has a second doping type, where the first doping type is one of N-type and P-type, and the second doping type is other one of the N-type and the P-type.

According to some embodiments of the present disclosure, another aspect of the embodiments of the present disclosure provides a method for fabricating the semiconductor device. The method includes: providing an active pillar, where a channel region and a source/drain region arranged on two sides of the channel region are formed in the active pillar; and forming a gate structure, where the gate structure surrounds at least part of the channel region, and the channel region includes a peripheral portion and a central portion. The peripheral portion is positioned between the gate structure and the central portion, the source/drain region and the peripheral portion have a first doping type, the central portion has a second doping type, the first doping type is one of N-type and P-type, and the second doping type is other one of the N-type and the P-type.

BRIEF DESCRIPTION OF THE DRAWINGS

Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Figures 1, 2:
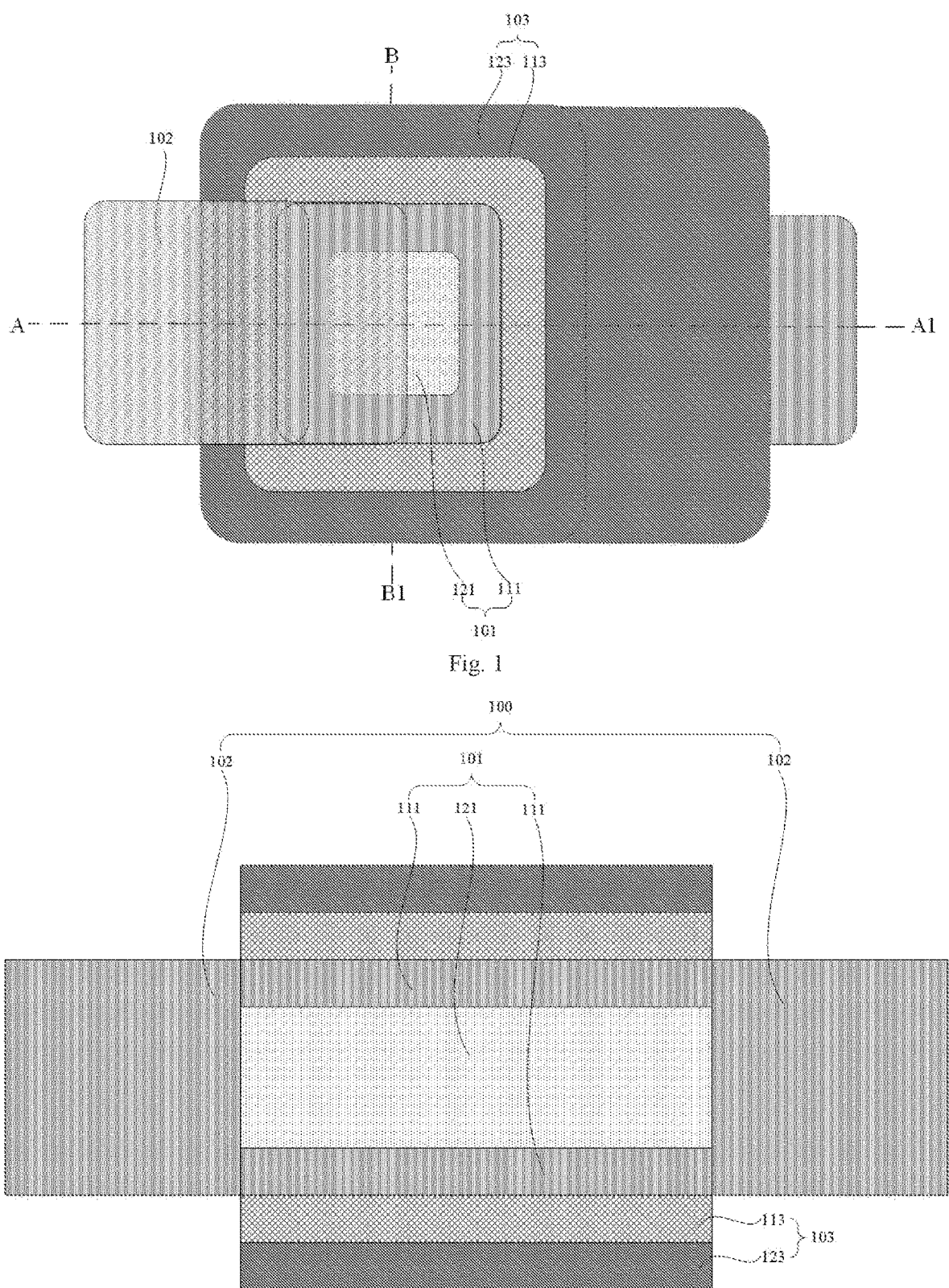
FIG. 1 is a three-dimensional diagram of a semiconductor device according to an embodiment of the present disclosure.
FIG. 2 is a schematic cross-sectional structural diagram of a semiconductor device according to an embodiment of the present disclosure.

As can be known from the background art, a semiconductor device in the prior art has problems of greater difficulty in turning off the semiconductor device and poorer turn-off effect.

After analysis, it is found that one of reasons for problems of greater difficulty in turning off the semiconductor device and poorer turn-off effect lies in that: in a conventional junctionless field effect transistor (JLFET), an entire channel region and a source/drain region (including a source and a drain) have the same doping type, and the channel region is an effective migration region in an off state. Although the semiconductor device should not generate a current in the off state in theory, in fact, there are still part of carriers moving in the effective migration region in the off state, resulting in leakage current in the off state, which makes it difficult to turn off the semiconductor device, and thus the turn-off effect is poor. In addition, due to the problems of greater difficulty in turning off the semiconductor device and poorer turn-off effect, it is needed to apply a reverse bias voltage to the gate or adopt a metal gate work function for adjustment to turn off the semiconductor device. However, applying the reverse bias voltage to the gate may increase extra power consumption of the semiconductor device, and adopting the metal gate work function for adjustment to turn off the semiconductor device requires the channel region of the semiconductor device to be as thin as possible, which increases fabrication difficulty of the semiconductor device.

The embodiments of the present disclosure provide a semiconductor device. In the embodiments of the present disclosure, the channel region including the peripheral portion and the central portion is provided in the semiconductor device. The source/drain region and the peripheral portion have the same first doping type, the central portion has the second doping type different from the first doping type of the source/drain region and the peripheral portion, where the first doping type is one of N-type and P-type, and the second doping type is other one of the N-type and the P-type. In this way, an effective transition width of the semiconductor device in an off state may be narrowed, and an off state current may be reduced, thereby solving the problem of greater difficulty in turning off the semiconductor device. In addition, the different doping types of the central portion and the peripheral portion of the channel region may increase energy of a conduction band and energy of a valence band, such that it is more difficult for carriers from the drain to reach the source, and thus the device has a better turn-off effect. Meanwhile, because the semiconductor device provided by the embodiments of the present disclosure has a better turn-off effect, it is neither needed to apply the reverse bias voltage to the gate nor needed to adopt the metal gate work function for adjustment to turn off the semiconductor device. Therefore, the power consumption and the fabrication difficulty of the semiconductor device can be reduced.

To make the objectives, technical solutions and advantages of the embodiments of the present disclosure more clear, the embodiments of the present disclosure will be described in detail below with reference to the accompanying drawings. However, a person of ordinary skill in the art may understand that in the embodiments of the present disclosure, many technical details are put forward such that a reader can better understand the present disclosure. However, the technical solutions requested to be protected by the present disclosure may also be implemented even without these technical details or various variations and modifications based on the following embodiments.

Figure 3:
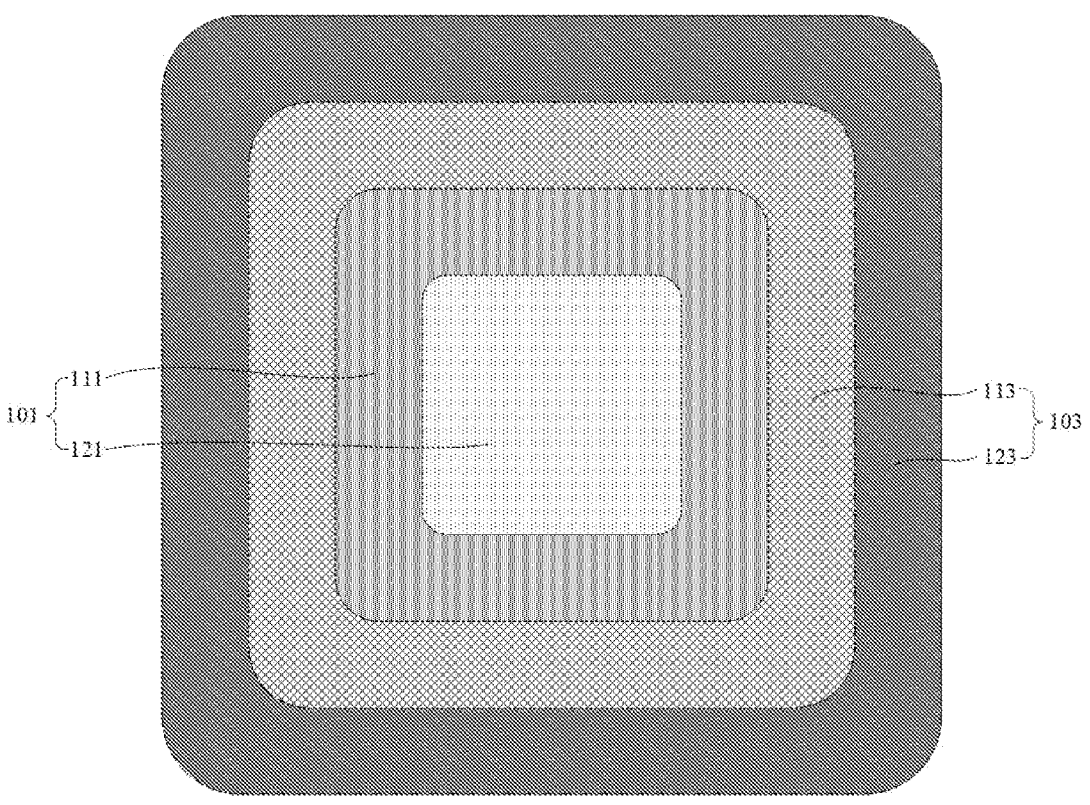
FIG. 3 is another schematic cross-sectional structural diagram of a semiconductor device according to an embodiment of the present disclosure.
Figure 4:
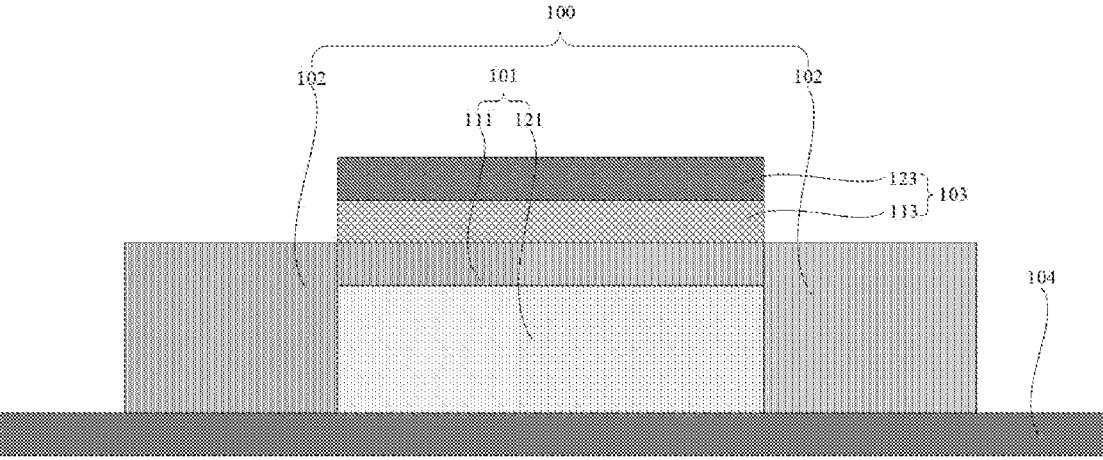
FIG. 4 is a schematic cross-sectional structural diagram of a semiconductor device according to an embodiment of the present disclosure.
Figure 5:
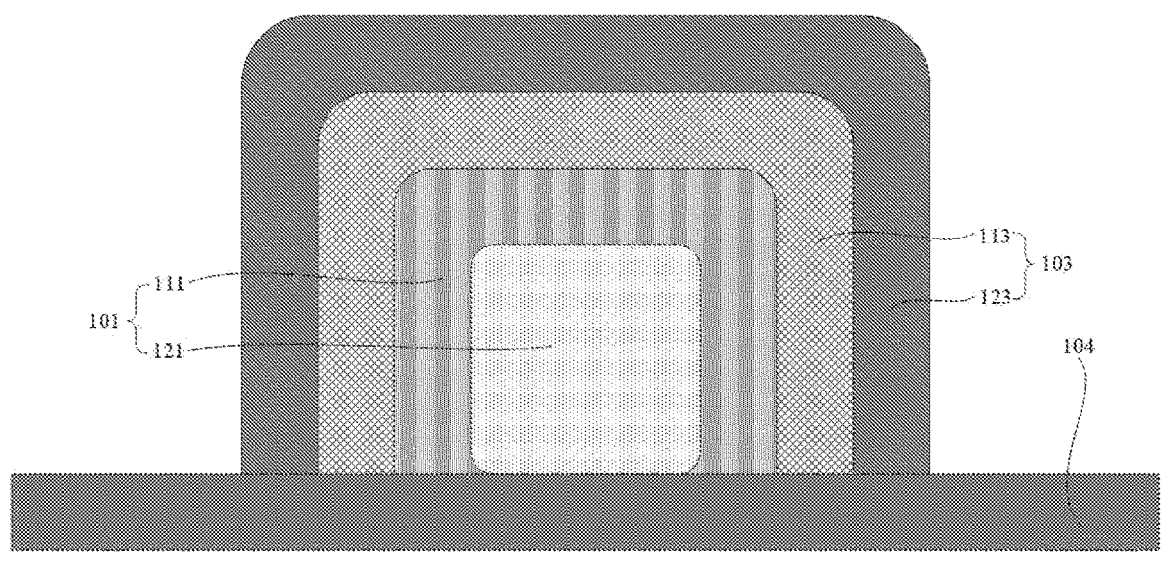
FIG. 5 is another schematic cross-sectional structural diagram of a semiconductor device according to an embodiment of the present disclosure.
Figure 6:
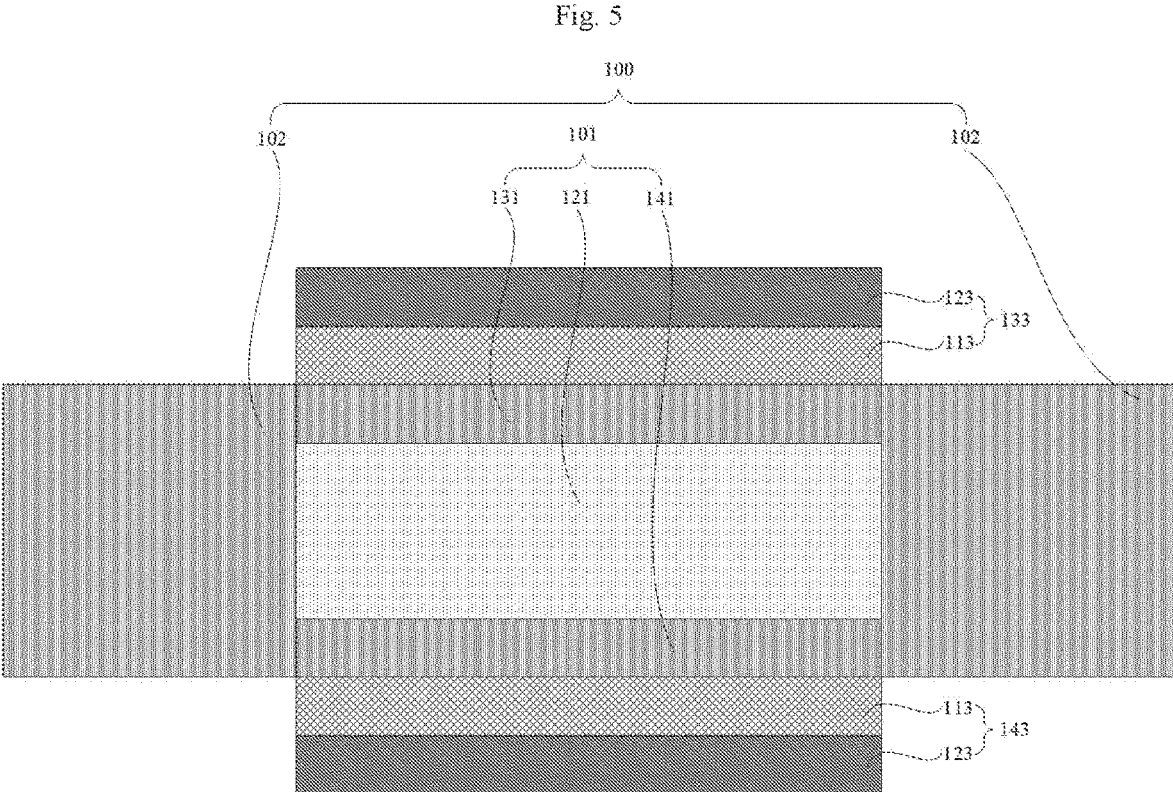
FIG. 6 is a schematic cross-sectional structural diagram of a semiconductor device according to an embodiment of the present disclosure.
Figure 7:
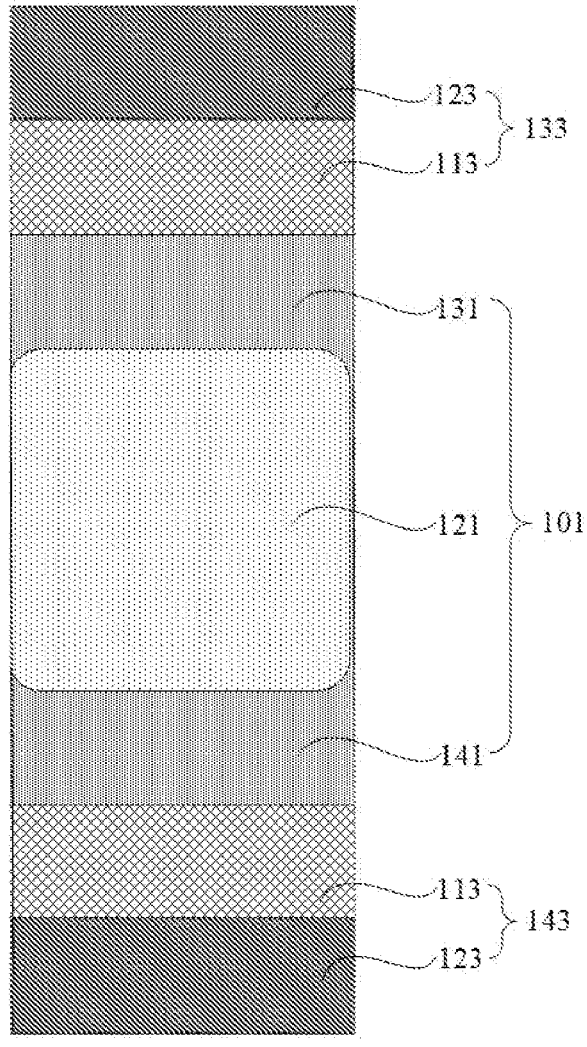
FIG. 7 is another schematic cross-sectional structural diagram of a semiconductor device according to an embodiment of the present disclosure.

FIG. 1 is a three-dimensional diagram of a semiconductor device according to an embodiment of the present disclosure; FIG. 2 is a schematic cross-sectional structural diagram cutting along a direction AA1 in FIG. 1; FIG. 3 is a schematic cross-sectional structural diagram cutting along a direction BB1 in FIG. 1; FIG. 4 is a schematic cross-sectional structural diagram of another semiconductor device according to an embodiment of the present disclosure; FIG. 5 is a schematic cross-sectional structural diagram of a semiconductor device shown in FIG. 4 in another direction; FIG. 6 is a schematic cross-sectional structural diagram of yet another semiconductor device according to an embodiment of the present disclosure; and FIG. 7 is a schematic cross-sectional structural diagram of a semiconductor device shown in FIG. 6 in yet another direction.

Referring to FIGS. 1 to 7, the semiconductor device includes: an active pillar 100, which includes a channel region 101 and a source/drain region 102 arranged on two sides of the channel region; and a gate structure 103 surrounding at least part of the channel region 101. The channel region 101 includes a peripheral portion 111 and a central portion 121, the peripheral portion 111 is positioned between the gate structure 103 and the central portion 121, the source/drain region 102 and the peripheral portion 111 have a first doping type, and the central portion 121 has a second doping type, where the first doping type is one of N-type and P-type, and the second doping type is other one of the N-type and the P-type.

By arranging the above semiconductor device, the channel region 101 may include the peripheral portion 111 and the central portion 121, where the peripheral portion 111 is positioned between the gate structure 103 and the central portion 121, and the source/drain region 102 and the peripheral portion 111 both have the same first doping type, the central portion 121 has the second doping type different from the first doping type of the source/drain region 102 and the peripheral portion 111, where the first doping type is one of N-type and P-type, and the second doping type is other one of the N-type and the P-type. In this case, the effective migration region is a region of the peripheral portion 111. In this way, an effective transition width of the semiconductor device in an off state may be narrowed, and an off state current may be reduced, thereby solving the problem of greater difficulty in turning off the semiconductor device. In addition, the different doping types of the central portion 121 and the peripheral portion 111 of the channel region may increase energy of a conduction band and energy of a valence band, such that it is more difficult for carriers from the drain to reach the source, and thus the device has a better turn-off effect. Meanwhile, because the semiconductor device provided by the embodiments of the present disclosure has a better turn-off effect, it is neither needed to apply the reverse bias voltage to the gate nor needed to adopt the metal gate work function for adjustment to turn off the semiconductor device. Therefore, the power consumption and the fabrication difficulty of the semiconductor device can be reduced.

The embodiments of the present disclosure will be described in detail below with reference to the accompanying drawings.

The material of the active pillar 100 may be single crystal or polycrystalline silicon, germanium, carbon nanotube, silicon germanium, silicon carbide, gallium arsenide, indium gallium, or other III-IV main group compounds. In some embodiments, the active pillar 100 may be a cylinder; and in some other embodiments, the active pillar 100 may also be a cuboid pillar.

The gate structure 103 may include: a gate dielectric layer 113 positioned on the surface of the channel region 101; and a gate electrode layer 123 positioned on the surface of the gate dielectric layer 113. A material of the gate dielectric layer 113 may be silicon dioxide, silicon oxynitride, hafnium oxide, zirconium oxide, hafnium zirconium oxide having any elemental composition ratio, and other insulating materials having a dielectric constant greater than 3.9. A material of the gate electrode layer 123 may be palladium (Pd), platinum (Pt), gold (Au), lanthanum (La), niobium (Nb) or lutetium (Lu), or an alloy in any ratio including at least two of these metal elements, and a conductive material such as a metal nitride in any ratio including at least one of these metal elements.

In some embodiments, the doping type of the source/drain region 102 and the doping type of the peripheral portion 111 may be N-type, and the doping type of the central portion 121 is P-type. In some other embodiments, the doping type of the source/drain region 102 and the doping type of the peripheral portion 111 may be P-type, and the doping type of the central portion 121 is N-type. Dopant ions of N-type doping may be at least one of P, As or Sb, dopant ions of P-type doping may be at least one of B, Ga or In, and dopant ions in the source/drain region 102 and dopant ions in the peripheral portion 111 may be the same. Different doping types of the central portion 121, the peripheral portion 111 and the source/drain region 102 may narrow the effective migration region in the channel region 101, and the effective migration region in this case is the region of the peripheral portion 111 having the same doping type as the source/drain region 102. The narrowing of the effective migration region may reduce the off-state leakage current, thereby solving the problem of greater difficulty in turning off the semiconductor device, and thus improving the turn-off effect.

In some embodiments, referring to FIGS. 1 to 3, the gate structure 103 may be a gate-all-around structure, the peripheral portion 111 fully surrounds the central portion 121, and the gate structure 103 fully surrounds the peripheral portion 111. The gate structure 103 is the gate-all-around structure, which is advantageous to increasing an effective channel length of the semiconductor device, such that capability of the gate structure in controlling the channel of the semiconductor device may be improved, and thus it is advantageous to further improving the problem of off-state leakage current.

In some embodiments, along a direction from one source/drain region 102 to another source/drain region 102, the gate structure 103, the peripheral portion 111 and the central portion 121 may be equal in length. In some other embodiments, along the direction from one source/drain region 102 to another source/drain region 102, the length of the gate structure 103 may also be greater than that of the central portion 121 and also may be greater than that of the peripheral portion 111, where the length of the central portion 121 is equal to that of the peripheral portion 111. That is, a projection of the gate structure 103 on the surface of the active pillar 100 partially overlaps with a projection of the source/drain region 102 on the surface of the active pillar 100.

Referring to FIGS. 4 to 7, in some embodiments, the gate structure 103 may be a gate-local-around structure 103, and the gate structure 103 surrounds part of a surface of the peripheral portion 111. In this case, the gate structure 103 may only surround the peripheral portion 111 in part of the region, and the gate structure 103 may be covered within a range of less than a circle on the outer surface of the active pillar 100.

In some embodiments, the gate structure 103 may be a gate-local-around structure 103; and the channel region 101 not covered by the gate structure 103 exposes a surface of the central portion 121. That is, in this case, the peripheral portion 111 may only surround the central portion 121 in part of the region, the region covered by the peripheral portion 111 is covered by the gate structure 103, and the region without the peripheral portion 111 is not covered by the gate structure 103.

Referring to FIG. 4 and FIG. 5, in some embodiments, the active pillar 100 is a cuboid pillar, the gate structure 103 surrounds part of a top surface of the active pillar 100 and part of a side surface opposite thereto, and a bottom surface of the active pillar 100 exposes the surface of the central portion 121. This is a three-sided gate-all-around structure in a gate-local-around semiconductor device. Correspondingly, the semiconductor device may further include a substrate 104, where the active pillar 100 and the gate structure 103 are both positioned on the substrate 104, and a side of the active pillar 100 not covered by the gate structure 103 is in contact with the substrate 104.

Referring to FIG. 6 and FIG. 7, in some other embodiments, the gate structure 103 may include: a first gate structure 133 and a second gate structure 143 arranged oppositely and separated from each other. The peripheral portion 111 includes: a first peripheral portion 131 positioned between the first gate structure 133 and the central portion 121; and a second peripheral portion 141 positioned between the second gate structure 141 and the central portion 121. This is a double-gate structure in a gate-local-around semiconductor device, and the active pillar 100 may be a cuboid pillar.

In some embodiments, a ratio of a thickness of the peripheral portion 111 to a thickness of the channel region 101 is within a range of 0.01 to 0.95. For example, the ratio of the thickness of the peripheral portion 111 to the thickness of the channel region 101 is 0.1, 0.25, 0.3, 0.4, 0.5, 0.75, 0.8, or 0.9. When the semiconductor device is in the off state, a region in the channel region 101 having the same doping type as the source/drain region 102 is the effective migration region for the carrier. In the embodiments of the present disclosure, the effective migration region is the region of the peripheral portion 111. It is to be understood that the smaller the width of the effective migration region is, the better the turn-off effect of the semiconductor device is; and conversely, the larger the width of the effective migration region is, the poorer the turn-off effect of the semiconductor device is. When the ratio of the thickness of the peripheral portion 111 to the thickness of the channel region 101 is too small, the thickness of the peripheral portion 111 is too small, and thus the width of the effective migration region of the semiconductor device is too small. In this case, although the turn-off effect of the semiconductor device is good, its operating effect in an operating state is poor. When the ratio of the thickness of the peripheral portion 111 to the thickness of the channel region 101 is too large, the thickness of the peripheral portion 111 is too large, and the effective transition width of the semiconductor device is too large. In this case, the objective of improving the turn-off effect of the semiconductor device cannot be well achieved. Therefore, the thickness of the effective migration region needs to be selected in an appropriate range. When the ratio of the thickness of the peripheral portion 111 to the thickness of the channel region 101 is within the range of 0.01 to 0.95, the semiconductor device may not only have a better turn-off effect, but also ensure a good operating effect in the operating state.

In some embodiments, a doping concentration of the central portion 121 is $1\times10^{15}$ atom/cm$^3$ to $1\times10^{19}$ atom/cm$^3$. For example, the doping concentration of the central portion 121 is $1\times10^{16}$ atom/cm$^3$, $\times10^{17}$ atom/cm$^3$, or $2\times10^{17}$ atom/cm$^3$. It is to be understood that, the lower the concentration of the carriers at the central portion 121 is, the weaker the capability of neutralizing the leakage current between the source/drain regions 102 is in the off state of the semiconductor device, and an improvement effect is poor. The higher the concentration of the carriers at the central portion 121 is, the carriers may be more likely neutralized by the central portion 121 when the semiconductor device is in the on state, which has a negative effect on transport of the carriers between the source/drain regions 102, such that the performance of the semiconductor structure is adversely affected. When the concentration of the carriers at the central portion 121 is higher than $1 \times 10^{19}$ atom/cm$^3$, the central portion 121 may adversely affect the transport of the carriers between the source/drain regions 102. When the concentration of the carriers at the central portion 121 is lower than $1 \times 10^{15}$ atom/cm$^3$, the capability of neutralizing the leakage current between the source/drain regions 102 is weaker in the off state of the semiconductor device, and the improvement effect is poor. Therefore, in the embodiments of the present disclosure, the doping concentration of the central portion 121 needs to be selected within an appropriate range to achieve a better effect of neutralizing the carriers in the source/drain region 102, thereby reducing the leakage current when the semiconductor device is in the off state.

In some embodiments, the doping concentration of the source/drain region is $1 \times 10^{18}$ atom/cm$^3$ to $1 \times 10^{21}$ atom/cm$^3$, for example, $1 \times 10^{19}$ atom/cm$^3$, $1 \times 10^{20}$ atom/cm$^3$, or $2 \times 10^{20}$ atom/cm$^3$. It is to be understood that, when the concentration of the carriers in the source/drain region 101 is too high, the leakage current may occur; and when the concentration of the carriers in the source/drain region 101 is too low, the performance of the semiconductor device may be poor. Therefore, the doping concentration of the source/drain region 101 needs to be selected within an appropriate range. When the doping concentration of the source/drain region 101 is within the range of $1 \times 10^{18}$ atom/cm$^3$ to $1 \times 10^{21}$ atom/cm$^3$, better operating performance of the semiconductor device may be ensured, and probability of generating the leakage current in the semiconductor device can also be reduced.

In some embodiments, the doping concentration of the peripheral portion 111 may be less than or equal to the doping concentration of the source/drain region 101, to ensure that the source/drain region have better conductive properties. The doping concentration of the peripheral portion 111 may be $1 \times 10^{16}$ atom/cm$^3$ to $1 \times 10^{20}$ atom/cm$^3$. For example, the doping concentration of the peripheral portion 111 may be $1 \times 10^{17}$ atom/cm$^3$, $\times 10^{18}$ atom/cm$^3$, or $2 \times 10^{18}$ atom/cm$^3$. Based on this concentration selection for the peripheral portion 111, it may be ensured that the peripheral portion 111 can achieve a channel conduction function in the operating state of the semiconductor device, and meanwhile, the turn-off effect can be improved in the off state of the semiconductor device.

In some embodiments, the doping concentration of the peripheral portion 111 gradually decreases in a direction toward the central portion 121. The carrier mobility of the peripheral portion close to the gate structure is better than that of the peripheral portion close to the central portion, such that a conductive path is mainly limited to the surface of the active pillar close to the gate structure, and the capability of the gate in controlling the channel region is improved.

The doping type of the source/drain region 101 and the doping type of the peripheral portion 111 are the first doping type. In some examples, when the first doping type is the N-type, a work function of a conductive layer in the gate structure 103 is greater than 4.6 eV; and when the first doping type is the P-type, the work function of the conductive layer in the gate structure 103 is less than 4.6 eV. A source of 4.6 eV is electron affinity of a silicon material (Kai=4.05 eV) plus one-half of silicon band gap (1.12 eV). For an N-channel metal oxide semiconductor (NMOS), after the work function is increased, it is equivalent to applying a greater negative bias voltage to make the system reach a flat-band voltage. In fact, a threshold voltage is increased, making it more difficult to turn on a circuit or easier to turn off the circuit. For a P-channel metal oxide semiconductor (PMOS), the work function is decreased, and the required negative gate voltage is also smaller. However, because the PMOS is turned on at a negative voltage and turned off at a positive voltage, it is actually advantageous to turning off the PMOS when the work function is decreased. Adjustment of the work function is related to an energy level of free electrons of Si—SiO$_2$-Metal. The smaller the work function is, the smaller the applied bias voltage required to reach the flat-band voltage is.

Figures 8, 9:
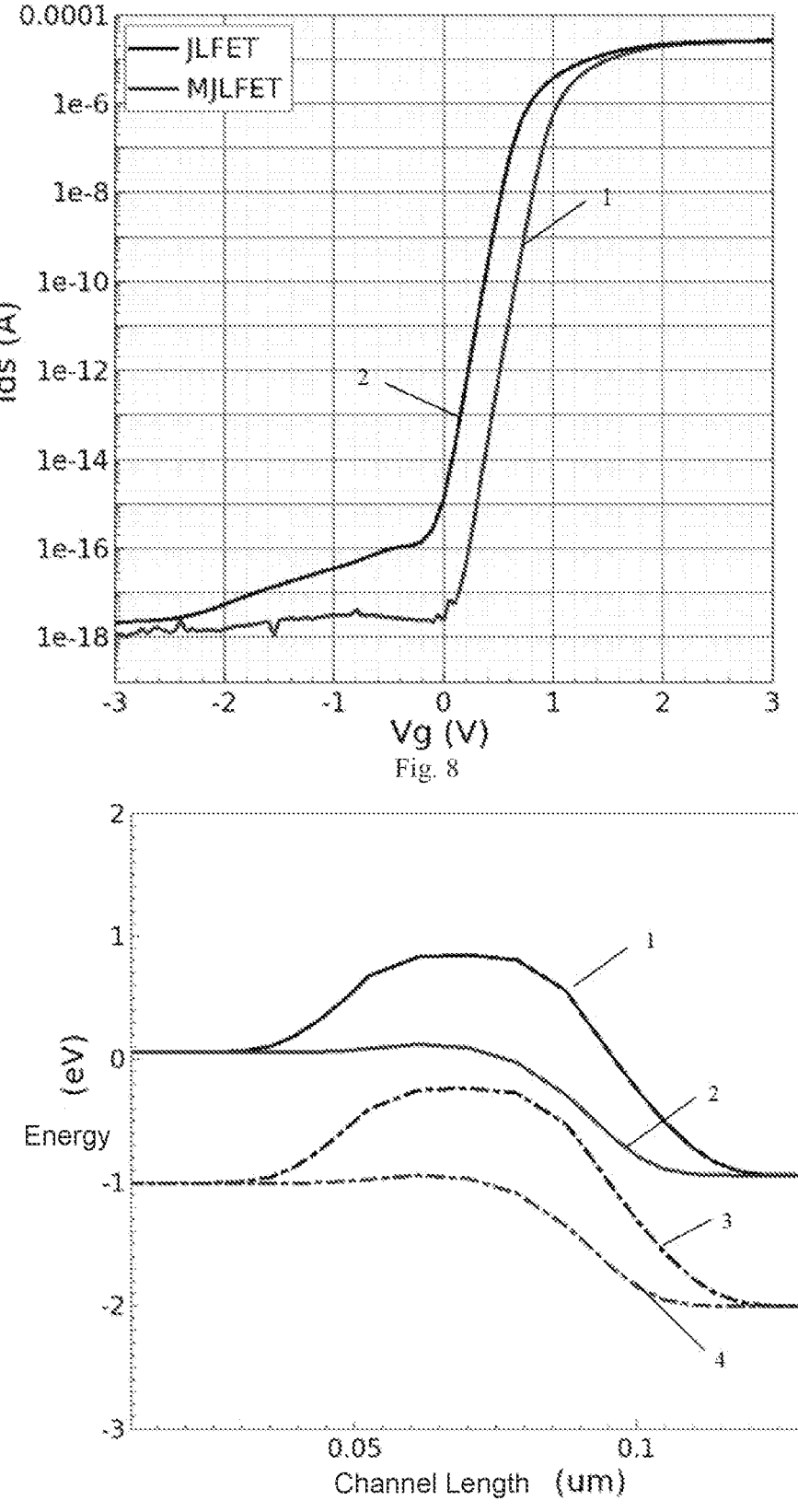
FIG. 8 is a comparison diagram showing leakage simulation between a semiconductor device provided by an embodiment of the present disclosure and a conventional semiconductor device.
FIG. 9 is a comparison diagram showing energy band calculation results along a channel direction between a semiconductor device provided by an embodiment of the present disclosure and a conventional semiconductor device.

When the first doping type is N-type, the material of the gate electrode layer 123 may be palladium (Pd), platinum (Pt) or gold (Au), or an alloy in any ratio including at least two of these metal elements, and a metal nitride in any ratio including at least one of these metal elements. When the first doping type is P-type, the material of the gate electrode layer 123 may be lanthanum (La), niobium (Nb) or lutetium (Lu), or an alloy in any ratio including at least two of these metal elements, and a metal nitride in any ratio including at least one of these metal elements. The work function is adjusted by means of an unconventional metal gate, such that the region where the channel region and the source/drain region are doped consistently can be turned off as quickly as possible. That is, the peripheral portion 111 can be turned off as quickly as possible, which further solves the problem of greater difficulty in turning off the semiconductor device, and improves the turn-off effect. Referring to FIG. 8, FIG. 8 is a comparison diagram showing leakage simulation between a semiconductor device provided by an embodiment of the present disclosure and a conventional semiconductor device. A line 2 represents a conventional JLFET, and a line 1 represents the semiconductor device provided by the present disclosure. The conventional JLFET and the semiconductor device (MJLFET) provided by the present disclosure are simulated by means of Synopsys Sentaurus TCAD. It may be found that the semiconductor device provided by the present disclosure in the off state (Vg=0 V) and the entire negative gate voltage region both have a lower leakage current than the conventional JLFET, and at a zero gate voltage, $I_{off}$(MJLFET)/$I_{off}$(JLFET)$\approx 10^{-3}$. For example, in the off state of the semiconductor device, $I_{off}$(MJLFET) $= 2.43 \times 10^{-18}$ A, and $I_{off}$(JLFET)$= 1.32 \times 10^{-15}$ A. This indicates that the power consumption of the semiconductor device in the present disclosure may be further controlled by means of the above structural features, and thus the leakage performance of the semiconductor device may be better.

Referring to FIG. 9, FIG. 9 is a comparison diagram showing energy band calculation results along a channel direction between a semiconductor device provided by an embodiment of the present disclosure and a conventional semiconductor device. The line 1 and a line 3 represent the conventional JLFET, and the line 2 and a line 4 represent the semiconductor device provided by the present disclosure. Based on the simulation result, it may be found that counter-doping of the channel increases the energy of the conduction band and the valence band of the semiconductor device, such that it is more difficult for the carriers from the drain to reach the source, and thus the device has a better turn-off effect.

In the semiconductor device provided by the embodiments of the present disclosure, the channel region 101 is arranged and includes the peripheral portion 111 and the central portion 121, where the peripheral portion 111 is positioned between the gate structure 103 and the central portion 121. The source/drain region 102 and the peripheral portion 111 both have the same first doping type, and the central portion 121 has the second doping type different from the first doping type of the source/drain region 102 and the peripheral portion 111, where the first doping type is one of N-type and P-type, and the second doping type is other one of the N-type and the P-type. In this case, the effective migration region is a region of the peripheral portion 111. In this way, an effective transition width of the semiconductor device in an off state may be narrowed, and an off state current may be reduced, thereby solving the problem of greater difficulty in turning off the semiconductor device. In addition, the different doping types of the central portion 121 and the peripheral portion 111 of the channel region may increase energy of a conduction band and energy of a valence band, such that it is more difficult for carriers from the drain to reach the source, and thus the device has a better turn-off effect. Meanwhile, because the semiconductor device provided by the embodiments of the present disclosure has a better turn-off effect, it is neither needed to apply the reverse bias voltage to the gate nor needed to adopt the metal gate work function for adjustment to turn off the semiconductor device. Therefore, the power consumption and the fabrication difficulty of the semiconductor device can be reduced.

Another embodiment of the present disclosure further provides a method for fabricating a semiconductor device, which may be used for forming the above semiconductor device. The method for fabricating the semiconductor device provided by another embodiment of the present disclosure will be described below with reference to the accompanying drawings. It should be noted that reference may be made to the corresponding descriptions of the foregoing embodiments for the same or corresponding parts of the foregoing embodiments, which will not be described in detail below.

Figure 10:
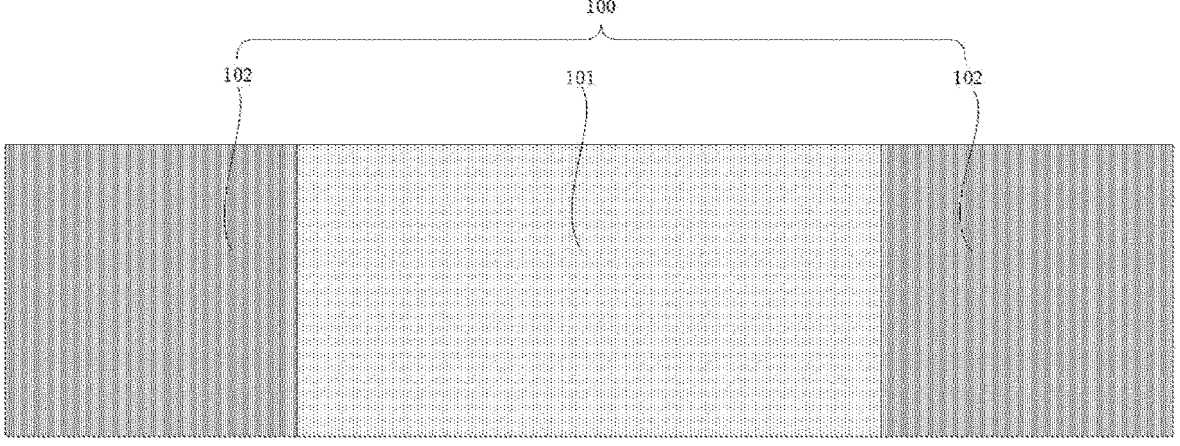
FIGS. 10 to 13 are schematic structural diagrams corresponding to steps of a method for fabricating a semiconductor device according to an embodiment of the present disclosure.
Figure 11:
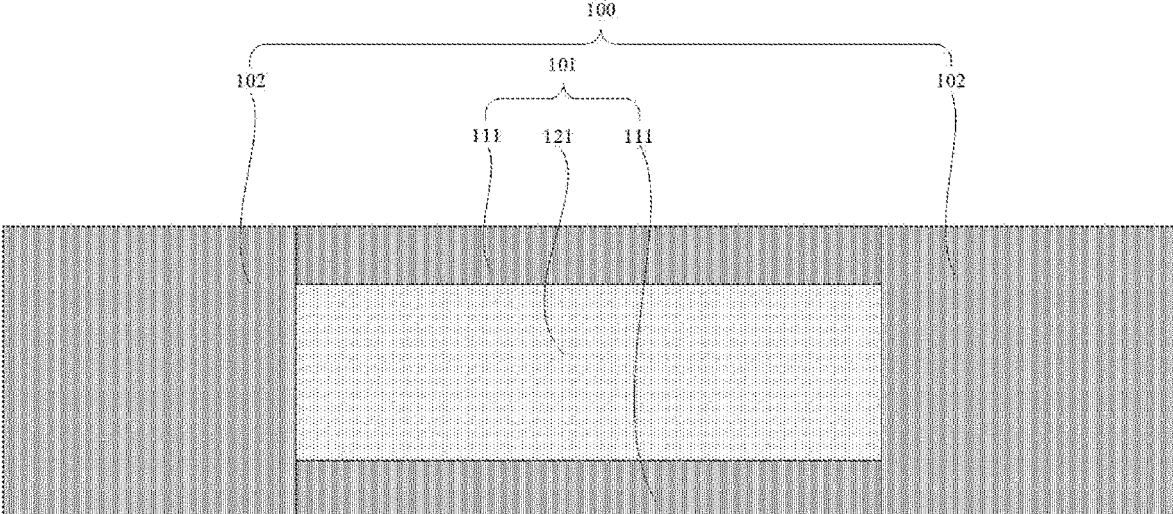

FIGS. 10 to 13 are schematic diagrams corresponding to steps of the method for fabricating the semiconductor device according to the present disclosure. Referring to FIG. 10, an active pillar 100 is provided, where a channel region 101 and a source/drain region 102 arranged on two sides of the channel region 101 are formed in the active pillar 100.

In some embodiments, the step of forming the active pillar 100, the channel region 101 and the source/drain region 102 may include: referring to FIG. 10, providing an initial active pillar having the second doping type, performing doping treatment of the first doping type on part of the initial active pillar, and converting the initial active pillar by part of a thickness into the peripheral portion 111, where the initial active pillar surrounded by the peripheral portion 111 forms the central portion 121. The central portion 121 and the peripheral portion 111 constitute the channel region 101. The doping treatment of the first doping type is performed on two ends of the initial active pillar to form the source/drain region 102, where the source/drain region 102 and the channel region 101 constitute the active pillar 100.

In some embodiments, a process for the doping treatment may be ion implantation. The ion implantation is performed on the initial channel region 101, by part of a thickness, of the initial active pillar 100 to form the peripheral portion 111.

Figures 12, 13:
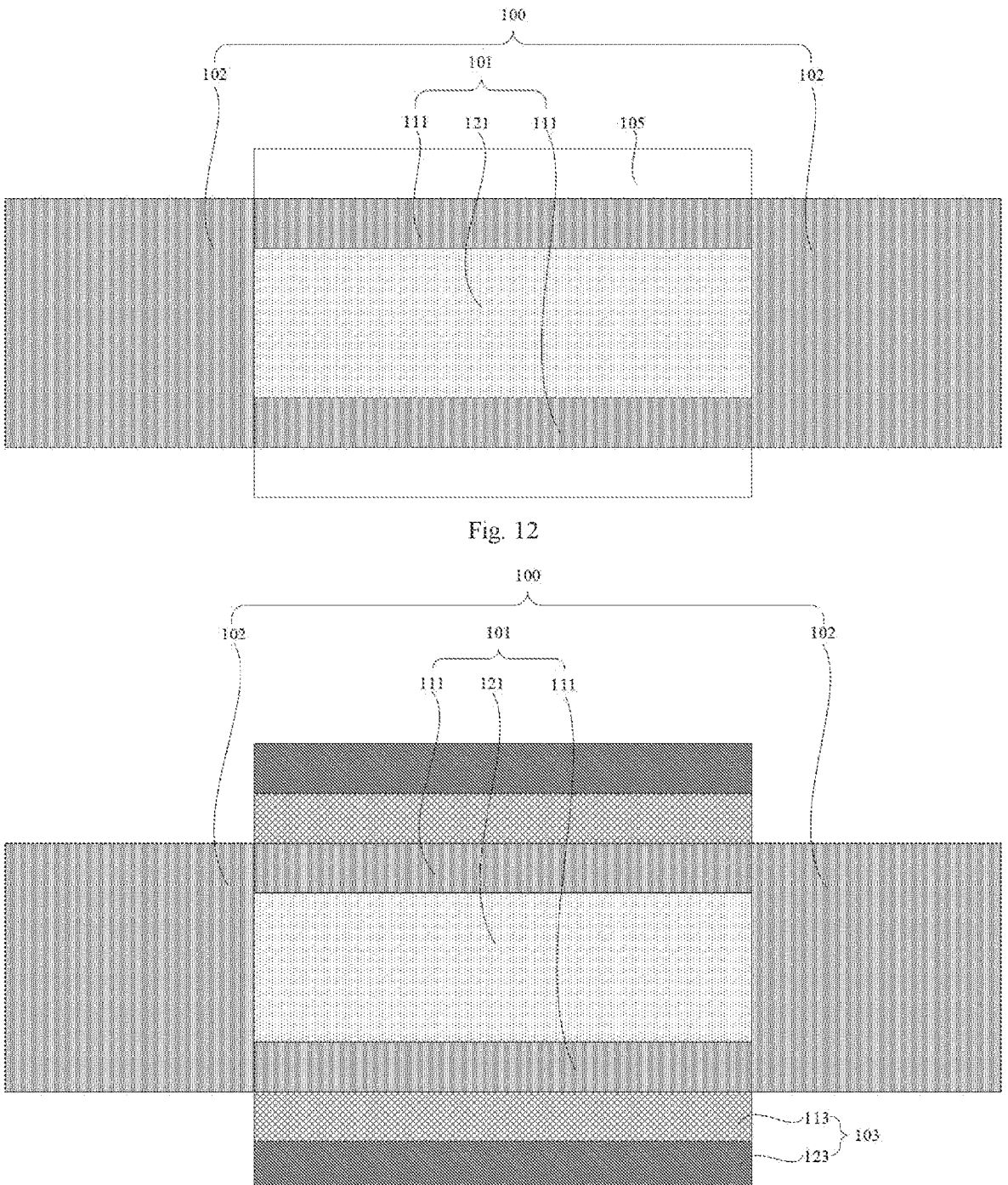

Referring to FIG. 12, in some other embodiments, the process for the doping treatment may also be thermal diffusion, and a region in the initial active pillar where the channel region is to be formed is defined as the initial channel region 101. A diffusion layer 105 is formed on the surface of the initial channel region 101 of the initial active pillar, where the diffusion layer 105 has second dopant ions therein. Next, the thermal diffusion process is performed, such that the second dopant ions are diffused into the initial channel region, by part of the thickness, of the initial active pillar to form the peripheral portion 111. Finally, the diffusion layer 105 is removed.

The process for the doping treatment may also be epitaxial deposition. In some embodiments, the initial active pillar is provided. The initial active pillar includes the central portion 121, the epitaxial process is performed on the outer surface of the central portion 121 to form the peripheral portion 111, and finally, the channel region 101 having the central portion 121 and the peripheral portion 111 is formed.

In some embodiments, referring to FIG. 13, after the channel region 101 is formed, a gate structure 103 is formed, where the gate structure 103 at least surrounds part of the channel region 101.

The channel region 101 includes the peripheral portion 111 and the central portion 121, where the peripheral portion 111 is positioned between the gate structure 103 and the central portion 121. The source/drain region 102 and the peripheral portion 111 both have a first doping type, and the central portion 121 has a second doping type, where the first doping type is one of N-type and P-type, and the second doping type is other one of the N-type and the P-type.

In the method for fabricating the semiconductor device provided by the embodiments of the present disclosure, the channel region 101 including the peripheral portion 111 and the central portion 121 is formed, where the peripheral portion 111 is positioned between the gate structure 103 and the central portion 121. The source/drain region 102 and the peripheral portion 111 both have the same first doping type, and the central portion 121 has the second doping type different from the first doping type of the source/drain region 102 and the peripheral portion 111, where the first doping type is one of N-type and P-type, and the second doping type is other one of the N-type and the P-type. In this case, the effective migration region is a region of the peripheral portion 111. In this way, an effective transition width of the semiconductor device in an off state may be narrowed, and an off state current may be reduced, thereby solving the problem of greater difficulty in turning off the semiconductor device. In addition, the different doping types of the central portion 121 and the peripheral portion 111 of the channel region may increase energy of a conduction band and energy of a valence band, such that it is more difficult for carriers from the drain to reach the source, and thus the device has a better turn-off effect. Meanwhile, because the semiconductor device provided by the embodiments of the present disclosure has a better turn-off effect, it is neither needed to apply the reverse bias voltage to the gate nor needed to adopt the metal gate work function for adjustment to turn off the semiconductor device. Therefore, the power consumption and the fabrication difficulty of the semiconductor device can be reduced.

Those of ordinary skill in the art can understand that the above-mentioned embodiments are some embodiments for realizing the present disclosure, but in practical applications, various changes may be made to them in form and details without departing from the spirit and scope of the present disclosure. Any person skilled in the art can make their own changes and modifications without departing from the spirit and scope of the present disclosure. Therefore, the protection scope of the present disclosure shall be subject to the scope defined by the claims.

What is claimed is:

1. A semiconductor device, comprising:

an active pillar, wherein the active pillar comprises a channel region and a source/drain region arranged on two sides of the channel region; and a gate structure surrounding at least part of the channel region, wherein the channel region comprises a peripheral portion and a central portion, the peripheral portion fully surrounds the central portion, the peripheral portion being positioned between the gate structure and the central portion, along a direction from one source/drain region to another source/drain region, a length of the central portion is equal to a length of the peripheral portion, the source/drain region and the peripheral portion having a first doping type, the central portion having a second doping type, the first doping type being one of N-type and P-type, and the second doping type being other one of the N-type and the P-type, and wherein a ratio of a thickness of the peripheral portion to a thickness of the channel region is within a range of 0.01 to 0.95.

2. The semiconductor device according to claim 1, wherein the gate structure is a gate-all-around structure; and the gate structure fully surrounds the peripheral portion.

3. The semiconductor device according to claim 1, wherein the gate structure is a gate-local-around structure, and the gate structure surrounds part of a surface of the peripheral portion.

4. The semiconductor device according to claim 2, wherein a shape of the active pillar comprises a cylinder or a cuboid.

5. The semiconductor device according to claim 3, wherein the gate structure is a gate-half-around structure; and the channel region not covered by the gate structure exposes a surface of the central portion.

6. The semiconductor device according to claim 5, wherein the active pillar is a cuboid pillar, the gate structure surrounds part of a top surface of the active pillar and part of a side surface opposite thereto, and a bottom surface of the active pillar exposes the surface of the central portion.

7. The semiconductor device according to claim 3, wherein the gate structure comprises: a first gate structure and a second gate structure arranged oppositely and separated from each other; and the peripheral portion comprises:

a first peripheral portion positioned between the first gate structure and the central portion; and a second peripheral portion positioned between the second gate structure and the central portion.

8. The semiconductor device according to claim 1, wherein a doping concentration of the central portion is $1\times10^{15}$ atom/cm$^3$ to $1\times10^{19}$ atom/cm$^3$.

9. The semiconductor device according to claim 1, wherein a doping concentration of the peripheral portion is less than or equal to a doping concentration of the source/drain region.

10. The semiconductor device according to claim 1, wherein the doping concentration of the source/drain region is $1\times10^{18}$ atom/cm$^3$ to $1\times10^{21}$ atom/cm$^3$; and the doping concentration of the peripheral portion is $1\times10^{16}$ atom/cm$^3$ to $1\times10^{20}$ atom/cm$^3$.

11. The semiconductor device according to claim 1, wherein the doping concentration of the peripheral portion gradually decreases in a direction toward the central portion.

12. The semiconductor device according to claim 1, wherein when the first doping type is the N-type, a work function of a conductive layer of the gate structure is greater than 4.6 eV; and when the first doping type is the P-type, the work function of the conductive layer of the gate structure is less than 4.6 eV.

13. A method for fabricating a semiconductor device, wherein the method comprises:

providing an active pillar, wherein a channel region and a source/drain region arranged on two sides of the channel region are formed in the active pillar; and forming a gate structure, wherein the gate structure surrounds at least part of the channel region, and the channel region comprises a peripheral portion and a central portion, the peripheral portion fully surrounds the central portion, the peripheral portion being positioned between the gate structure and the central portion, along a direction from one source/drain region to another source/drain region, a length of the central portion is equal to a length of the peripheral portion, the source/drain region and the peripheral portion having a first doping type, the central portion having a second doping type, the first doping type being one of N-type and P-type, and the second doping type being other one of the N-type and the P-type, and wherein a ratio of a thickness of the peripheral portion to a thickness of the channel region is within a range of 0.01 to 0.95.

14. The method according to claim 13, wherein the forming the channel region comprises:

providing an initial active pillar having the second doping type, performing doping treatment of the first doping type on part of the initial active pillar, and converting the initial active pillar by part of a thickness into the peripheral portion, the initial active pillar surrounded by the peripheral portion forming the central portion.

15. The method according to claim 14, wherein a process for the doping treatment comprises any one of ion implantation, thermal diffusion, and epitaxial deposition.

* * * * *